(12) United States Patent
Akashi et al.

(10) Patent No.: US 7,629,059 B2
(45) Date of Patent: Dec. 8, 2009

(54) ORGANO-ELECTRONIC FUNCTIONAL MATERIAL AND USE THEREOF

(75) Inventors: Nobutaka Akashi, Kobe (JP); Yasuhiko Shirota, Toyonaka (JP)

(73) Assignee: Bando Chemical Industries, Ltd., Hyogo (JP)

( * ) Notice: Subject to any disclaimer, the term of this patent is extended or adjusted under 35 U.S.C. 154(b) by 387 days.

(21) Appl. No.: 10/580,052

(22) PCT Filed: Nov. 17, 2004

(86) PCT No.: PCT/JP2004/017440

§ 371 (c)(1),
(2), (4) Date: May 19, 2006

(87) PCT Pub. No.: WO2005/051047

PCT Pub. Date: Jun. 2, 2005

(65) Prior Publication Data

US 2007/0066848 A1    Mar. 22, 2007

(30) Foreign Application Priority Data

Nov. 21, 2003   (JP)   ............................. 2003-391882
Dec. 3, 2003    (JP)   ............................. 2003-404721

(51) Int. Cl.
*H01L 51/54*   (2006.01)
*C07C 211/54*  (2006.01)

(52) U.S. Cl. ................... 428/690; 428/917; 564/434; 313/504; 313/506; 257/40; 257/E51.051

(58) Field of Classification Search ............... 313/504, 313/506; 257/40, E51.051; 564/434
See application file for complete search history.

(56) References Cited

U.S. PATENT DOCUMENTS

| 5,061,569 A | 10/1991 | VanSlyke et al. |
| 7,273,953 B2 * | 9/2007 | Kubo et al. ............... 564/405 |
| 2002/0051918 A1 * | 5/2002 | Miyamoto et al. ....... 430/58.65 |
| 2003/0146443 A1 * | 8/2003 | Yamazaki et al. ........... 257/80 |

FOREIGN PATENT DOCUMENTS

| EP | 0 611 148 A1 | 8/1994 |
| JP | 1-224353 A | 9/1989 |
| JP | 04-126790 A * | 4/1992 |
| JP | 5-234681 A | 9/1993 |
| JP | 07-033717 A * | 2/1995 |
| JP | 7-33717 A | 2/1995 |
| JP | 7-90256 A | 4/1995 |
| JP | 7-97355 A | 4/1995 |
| JP | 8-291115 A | 11/1996 |
| JP | 11-174707 A | 7/1999 |
| JP | 11-176572 A * | 7/1999 |
| JP | 2003-68470 A | 3/2003 |
| JP | 2003-178883 A | 3/2003 |
| JP | 2004-155754 A | 6/2004 |

OTHER PUBLICATIONS

Translation for JP 11-17657 A, published Jul. 1999.*
Translation for JP 07-033717 A, published Feb. 1995.*
International Search Report of PCT/JP2004/017440, dated Mar. 1, 2005.
Inada "Creation of Photo- and Electro-active Amorphous Molecular Materials." Bando Technical Report, No. 2, 1998, pp. 9-18.

* cited by examiner

*Primary Examiner*—Dawn Garrett
(74) *Attorney, Agent, or Firm*—Hamre, Schumann, Mueller & Larson, P.C.

(57) ABSTRACT

The invention provides an organo-electronic functional material comprising a tris(arylamino)benzene represented by the general formula (I)

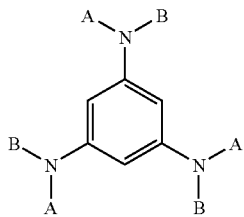

(I)

wherein A and B are each a group represented by the general formula (II)

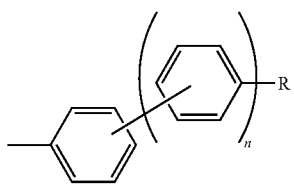

(II)

in which R is an alkyl group of 1-6 carbons or a cycloalkyl group of 5 or 6 carbon atoms and n is 0, 1, 2 or 3, and A and B may be the same or different from each other, and exhibiting a cyclic voltamogram in which a deviation of peak current of cyclic curves as measured 50 times at a sweep rate of 20 mV/s falls within ±10% of the average of peak current.

The organo-electronic functional material has an opto-electronic exchanging function, a reversible oxidation-reduction property and a high glass transition temperature, and can form amorphous film in itself. In addition, it is stable and exhibits only slight variation of peak current in repeated oxidation-reduction process so that it is suitable for use as, for example, a hole transporting material among others in various electronic devices including an organic electroluminescence element.

6 Claims, 6 Drawing Sheets

ORGANO-ELECTRONIC FUNCTIONAL MATERIAL AND USE THEREOF

FIELD OF THE INVENTION

The invention relates to an organo-electronic functional material and use thereof. More particularly, the invention relates to an organo-electronic functional material which comprises a tris(arylamino)benzene and is superior in repeated oxidation-reduction process and is hence suitable for use as, for example, a hole transporting agent. The invention further relates to such a hole transporting agent which comprises the organo-electronic functional material and an organic electroluminescence element having a hole transporting layer formed of the hole transporting agent.

BACKGROUND ART

In recent years, a variety of electronic devices such as organic semiconductors or light-emitting elements in which an organic compound which has photoelectric function as well as reversible oxidation-reduction characteristics and can form amorphous film in itself is used as an organo-electronic material, for example, as a hole transporting agent, have attracted considerable attention. Such an amorphous film of organic substances are formed by preparing a coating composition comprised of a binder resin such as polycarbonate resin and the organic compound dissolved in a suitable organic solvent and then by coating and drying the composition, as described in JP-A-11-174707. An organic amorphous film is also formed by preparing a coating composition comprised of a multinuclear aromatic tertiary amine called a "star-burst" compound dissolved in a suitable organic solvent and then by coating the composition on a substrate and drying it, as described in JP-A-08-291115.

According to a method using a binder resin among the methods mentioned above, the organic compound is diluted with the binder resin in the resulting amorphous film and influenced by the binder resin so that the organic compound cannot exhibit sufficiently the functions that it originally has as an organo-electronic functional material. In addition, if the organic compound forms an amorphous film that is stable at normal temperature with the aid of a binder resin, the organic compound has a low glass transition temperature so that the film is poor in heat resistance and has a problem in stability and life.

Under these circumstances, polynuclear aromatic tertiary amine compounds called the "star-burst" molecules are attracting considerable attention since they are capable of forming amorphous film in themselves at normal temperatures, as described above. The star-burst molecules are divided into three groups based on their molecular structures: compounds having a triphenylamine structure (triphenylamines), compounds having a triaminobenzene structure (triaminobenzenes) and compounds having a triphenylbenzene structure (triphenylbenzenes).

Examples of the triphenylamines include, for example, 4,4',4''-tris-(N,N-diphenylamino)triphenylamine (TDATA) and 4,4',4''-tris(N-phenyl-N-m-tolylamino)triphenylamine (m-MTDATA), as described in JP-A-01-224353, and in addition, 4,4',4''-tris(N-(2-naphthyl)-N-phenylamino)triphenylamine (2-TNATA), as described in JP-A-08-291115.

These triphenylamines are reversible in oxidation-reduction process and can form amorphous film by a vapor deposition method, however, TDATA and m-MTDATA have a problem in heat resistance. TNATA has a glass transition temperature of about 110° C. and is superior in heat resistance, but it is readily crystallized so that the amorphous film formed therewith is lacking in stability.

Examples of the triphenylbenzenes include, for example, 1,3,5-tris(4-(N,N-diphenylaminophenyl)benzene (TDAPB) and 1,3,5-tris(4-(N-tolyl-N-phenylaminophenyl)benzene (MTDAPB), as described in Bando Technical Report, Vol. 2, pp. 9-18, 1998 (Bando Chemical Industries, Ltd.). These triphenylbenzenes also can form amorphous film and have oxidation potentials in the range of 0.6-0.7V, but they are irreversible in oxidation-reduction process so that they are not suitable for practical use as an organo-electronic functional material such as a hole transporting agent.

On the other hand, examples of the triaminobenzenes include 1,3,5-tris(N-methylphenyl-N-phenylamino)benzene (MTDAB). The triaminobenzenes also have oxidation potentials in the range of 0.6-0.7V, but they are irreversible in oxidation-reduction process so that they are also not suitable for practical use as an organo-electronic function material.

The present inventors have presented 1,3,5-tris(N-(p-methylphenyl)-N-(-1-naphthyl))aminobenzene (p-MTPNAB) and 1,3,5-tris(N-(p-methylphenyl)-N-(4-biphenyl)amino)benzene (p-MTPBAB) as such organic compounds that are reversible in oxidation-reduction process, have oxidation potentials in the range of 0.5-0.7V, are superior in heat-resistance, and can form amorphous film by a vapor deposition method, as described in Japanese Patent Application No. 2003-079441.

The above-mentioned p-MTPNAB and p-MTPBAB are reversible in oxidation-reduction process and have high oxidation potentials as well as high glass transition temperature, i.e., 87° C. and 98° C., respectively. However, when they are subjected to repeated oxidation-reduction process, peak currents of oxidation curves tend to fall, and accordingly, there is a fear that they have not enough stability and durability for use as organo-electronic functional material.

On the other hand, a hole transporting agent comprising a polynuclear aromatic tertiary amine compound having a biphenyl skeleton is also known. Examples of such polynuclear aromatic tertiary amine compounds include 4,4'-bis (N-(3-methylphenyl)-N-phenylamino)-biphenyl (TPD), as described in JP-A-07-090256, and 4,4'-bis(N-(1-naphthyl)-N-phenylamino)biphenyl (α-NPD), as described in JP-A-05-234681 However, an organic electroluminescence element manufactured by using these compounds as a hole transporting agent needs a high voltage to be driven.

The invention has been completed to solve the problem involved in the known organo-electronic functional materials as mentioned above. Therefore, it is an object of the invention to provide an organo-electronic functional material which has an opto-electronic function, is reversible in oxidation-reduction process, can form amorphous film in itself, and has a high glass transition temperature, and shows only a slight change of peak current when being subjected to repeated oxidation-reduction process, and is hence superior in stability.

SUMMARY OF THE INVENTION

The invention provides an organo-electronic functional material comprising a tris(arylamino)benzene represented by the general formula (I)

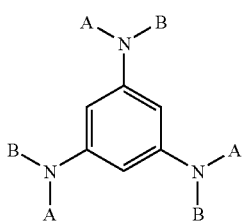

wherein A and B are each a group represented by the general formula (II)

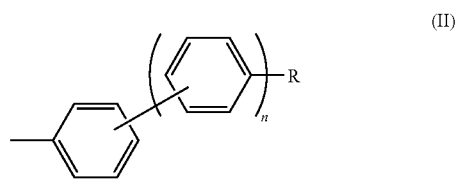

in which R is an alkyl group of 1-6 carbons or a cycloalkyl group of 5 or 6 carbon atoms and n is 0, 1, 2 or 3, and A and B may be the same or different from each other, and exhibiting a cyclic voltamogram in which a deviation of peak current of cyclic curves measured 50 times at a sweep rate of 20 mV/s falls within ±10% of the average of peak current.

The invention further provides a hole transporting agent comprising the above-mentioned organo-electronic functional material, and an organic electroluminescence element having a hole transporting layer containing the above-mentioned hole transporting agent.

THE BEST MODE FOR CARRYING OUT THE INVENTION

Figure 1:
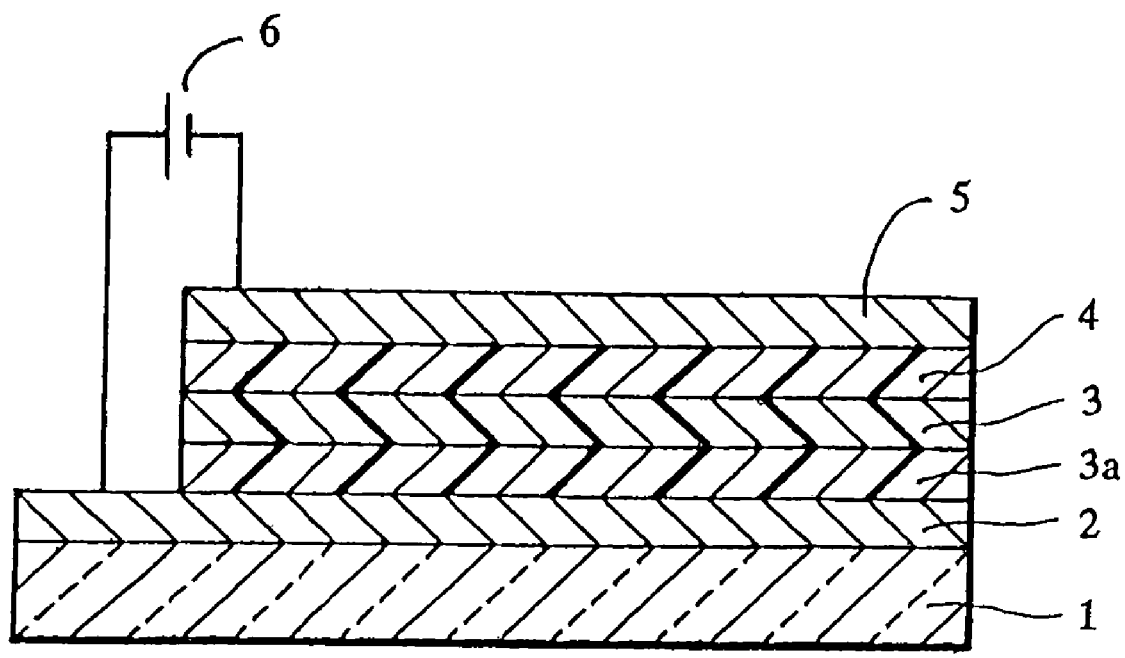
FIG. 1 is a cross section showing an example of an organic electroluminescence element.

The organo-electronic functional material of the invention comprises a tris(arylamino)benzene represented by the general formula (I)

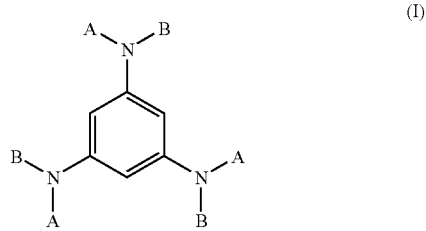

wherein A and B are each a group represented by the general formula (II)

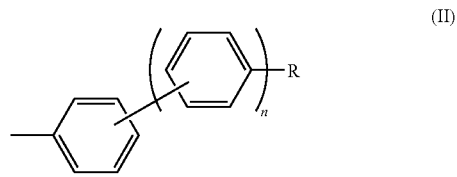

in which R is an alkyl group of 1-6 carbons or a cycloalkyl group of 5 or 6 carbon atoms and n is 0, 1, 2 or 3, and A and B may be the same or different from each other.

In the tris(arylamino)benzenes represented by the general formula (I), the group A and B are each a phenyl group having the alkyl group or cycloalkyl group, a biphenylyl group having the alkyl group or cycloalkyl group at the terminal, a terphenyl group having the alkyl group or cycloalkyl group at the terminal, or a quaterphenyl group having the alkyl group or cycloalkyl group at the terminal, and the group A and B may be the same or different from each other.

It is particularly preferred that the tris(arylamino)benzenes represented by the general formula (I) have a biphenylyl group having the alkyl group or cycloalkyl group at the para-position of the terminal phenyl group as the group A and a phenyl group having the alkyl group or cycloalkyl group at the para-position as the group B since these tris(arylamino)benzenes are excellent in reversibility of oxidation-reduction process, oxidation-reduction potential and heat resistance when being used as organo-electronic functional materials.

The alkyl group is methyl, propyl, butyl, pentyl or hexyl group, and may be linear or branched, while the cycloalkyl group is cyclopentyl or cyclohexyl group.

Among the tris(arylamino)benzenes, an organo-electron functional material comprising 1,3,5-tris(N-(4'-methyl-4-biphenylyl)-N-(p-tolyl)amino)benzene represented by the formula (IV)

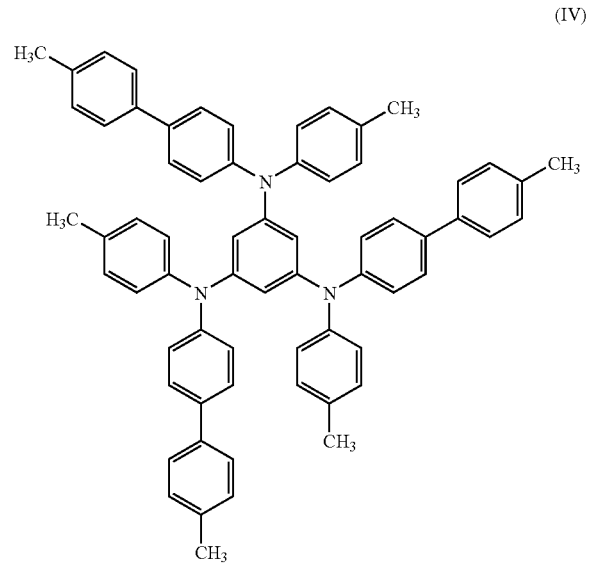

is superior in stability in repeated oxidation-reduction process and is suitable for use as hole transporting agent in various electronic devices.

As shown in the scheme below, 1,3,5-tris(N-(4'-methyl-4-biphenylyl)-N-(p-tolyl)amino)benzene can be obtained by, for example, reacting 1,3,5-tris(p-tolyl)aminobenzene (V) with 4-iodo-4'-methylbiphenyl (VI).

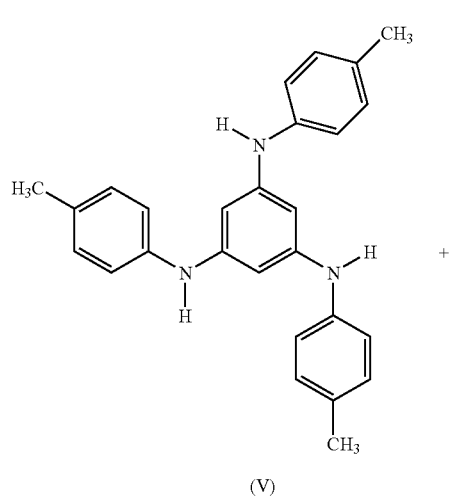

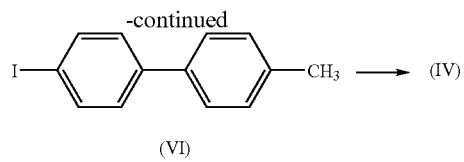

As described above, the organo-electronic functional material of the invention comprises such a tris(arylamino) benzene in which each of the chemically active sites at the terminal of the aryl groups of the arylamino groups, preferably a carbon atom of para-position of phenyl group, is substituted or capped with a stable substituent such as an alkyl or a cycloalkyl mentioned hereinabove, so that the tris(arylamino)benzene is provided with improved reversibility in repeated oxidation-reduction process while retaining oxidation-reduction characteristics, high oxidation potential and high glass transition temperature of tris(arylamino)benzene, one of the "star-burst" molecules. Accordingly, the organo-electronic functional material of the invention shows only a slight change in the values of peak current in the repeated oxidation-reduction process, and can be used as a stable and durable organo-electronic functional material in various electronic devices.

The organic electroluminescence element is driven by a direct current at a low electric voltage with high efficiency to emit light at a high luminance, as well as it can be made thin. Accordingly, in recent years, the investigation to put the organic electroluminescence element to practical use as display devices as well as backlights or illumination devices is pushed forward.

As an example is shown in FIG. 1, the electroluminescence element is comprised of a transparent substrate 1 made of glass, for example, having an anode 2 made of a transparent electrode such as an ITO membrane (indium oxide-tin oxide membrane) laminated thereon, and a hole injecting layer 3a, a hole transporting layer 3, an emitting layer 4 and a cathode 5 made of a metal or a compound thereof laminated on the anode in this order. The anode and the cathode are connected with an external power source 6. In some cases, a hole injecting layer 3a may be omitted, and an electron transporting layer may be laminated between the emitting layer and the cathode. An electroconductive polymer layer (a buffer layer) may be laminated between the anode and the hole transporting layer. Many other layer structures to form organic electroluminescence elements are already known.

The electroluminescence element of the invention is featured in that it has a hole transporting layer formed of a tris(arylamino)benzene represented by the general formula (I), a hole transporting agent of the invention, but is not specifically limited in layer structures. The thickness of hole transporting layer is usually in the range of 10 nm to 200 nm.

In such an organic electroluminescence element as mentioned above, the hole transporting layer adheres to the anode, and transports holes from the anode to the emitting layer while blocking electrons, whereas the electron transporting layer adheres to a cathode, and transports electrons from the cathode to the emitting layer. Thus, when an electron injected from the cathode and a hole injected from the anode recombine in the emitting layer, light is emitted and radiated outside through the transparent electrode (anode) and the transparent substrate.

In the organic electroluminescence element of the invention, the layers except the hole transporting layer mentioned above, that is, a transparent substrate, an anode, an emitting layer, an electron transporting layer and a cathode, may be made of any conventionally known materials. For example, an anode or transparent electrode may be made of indium oxide-tin oxide (ITO), and a cathode may be made of a metal such as aluminum, magnesium or silver, or an alloy of these metals, such as Al—Mg alloy, Ag—Mg alloy, or a metal compound. A transparent substrate is usually made of glass.

The emitting layer is usually formed of tris(8-quinolinol) aluminum ($Alq_3$) and has a thickness in the range of 10 nm to 200 nm. The electron transporting layer has also a thickness in the range of 10 nm to 200 nm. When an electroconductive polymer layer is employed, it has also a thickness in the range of 10 nm to 200 nm.

When the organo-electronic functional material of the invention is used as a hole transporting agent, a hole injecting layer that is formed of copper phthalocyanine (CuPC), a known hole injecting agent, may be placed between the anode and the hole transporting layer so that the energy gap between the anode and hole transporting layer is made small and holes are readily transported from the anode to the hole transporting layer.

Further according to the invention, an organic electroluminescence element that is driven by a direct current at a lower electric voltage to emit light at a high luminance is obtained by using the organo-electronic functional material of the invention as a hole transporting agent in conjunction with a tris(4-(N,N-diarylamino)-phenyl)amine represented by the general formula (III)

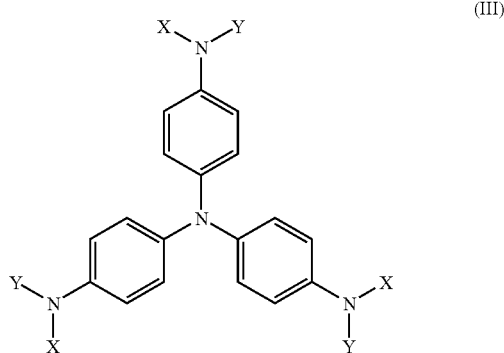

(III)

wherein X and Y are each an aryl group and may be the same or may be different from each other. That is, according to the invention, the voltage-luminance characteristics of an organic electroluminescence element is much more improved by laminating a hole injecting layer formed of the tris(4-(N,N-diarylamino)phenyl)amine represented by the general formula (III) as a hole injecting agent and a hole transporting layer formed of the organo-electronic functional material of the invention as a hole transporting agent.

If necessary, a uniform mixture of tris(4-(N,N-diarylamino)-phenyl)amine represented by the general formula (III) and the organo-electronic functional material of the invention may be used as a hole transporting agent in manufacture of organic electroluminescence elements.

In the tris(4-(N,N-diarylamino)phenyl)amine represented by the general formula (III), X and Y are each an aryl group and may be the same or different from each other. Examples of such aryl groups include phenyl, o-, m- or p-tolyl, 1- or 2-naphthyl, 4-p-biphenylyl and 4-p-terphenylyl. Thus, Examples of the tris(4-(N,N-diarylamino)-phenyl)amine include, as mentioned hereinbefore, 4,4',4"-tris(N,N-diphenylamino)triphenylamine (TDATA), 4,4',4"-tris(N-phenyl-N-m-tolylamino)triphenylamine (m-MTDATA) and 4,4',4"-tris(N-(2-naphthyl)-N-phenylamino)triphenylamine (2-TNATA), although the tris(4-(N,N-diarylamino)phenyl) amine usable are not limited to those exemplified.

INDUSTRIAL APPLICABILITY

The organo-electronic functional material of the invention has reversible oxidation-reduction characteristics as well as high oxidation potential and high glass transition temperature, and further it forms amorphous film stable at room temperature in itself by vapor deposition, etc. In addition, the organo-electronic functional material of the invention exhibits a deviation of peak current of cyclic curves as measured 50 times at a sweep rate of 20 mV/s falls within ±10%, and in a preferred embodiment, within ±5%, of the average of peak current in the measurement of voltamogram to illustrate the reversibility of oxidation-reduction process. The organo-electronic functional material of the invention is thus superior in reversibility in oxidation-reduction process so that it shows only slight change of peak current in repeated oxidation-reduction process and maintains the initial performance over a long period of time. Therefore, the organo-electronic functional material of the invention is suitable for use as an organo-electronic functional material such as a hole transporting agent in various electronic devices, for instance, in an organic electroluminescence element.

EXAMPLES

The invention is described in more detail with reference to examples, however, the invention is not limited thereto.

Example 1

Synthesis of 1,3,5-tris(p-tolylamino)benzene 11.8 g of phloroglucinol, 50 g of p-toluidine and 0.5 g of iodine were placed in a 300 mL capacity three necked flask and the reaction was carried out at a temperature of 150° C. with stirring under a nitrogen atmosphere. After the reaction, the resultant reaction mixture was washed with methanol, hexane and methanol in this order, followed by drying to provide 31.9 g of the desired 1,3,5-tris(p-tolylamino)benzene as slightly reddish solid. The yield was 86.5%.

Synthesis of 1,3,5-tris(N-(4'-methyl-4-biphenylyl)-N-(p-tolyl)amino)-benzene (p-MBTAB)

2.0 g of 1,3,5-tris(p-tolylamino)benzene, 7.0 g of 4-iodo-4'-methylbiphenyl, 6.9 g of potassium carbonate, 1.0 g of copper powder, 0.7 g of 18-crown-6 (or 1,4,7,10,13,16-hexaoxacyclooctadecane) and 15 mL of mesitylene (reaction solvent) were placed in a 100 mL capacity glass flask and the reaction was carried out at a temperature of 170° C. for 15 hours under a nitrogen atmosphere. After the reaction, the resultant reaction mixture was extracted with toluene and the toluene solution was subjected to silica gel chromatography to fractionate the reaction product. The reaction product was then purified by recrystallization and then by sublimation to provide the desired 1,3,5-tris(N-(4'-methyl-4-biphenylyl)-N-(p-tolyl)amino)benzene (p-MBTAB). The yield was 15.6%.

Elemental Analysis (%):

|  | C | H | N |
|---|---|---|---|
| Calculated: | 88.89 | 6.40 | 4.71 |
| Measured: | 88.69 | 6.55 | 4.76 |

Mass Analysis: 892 (M$^+$)

Figure 2:
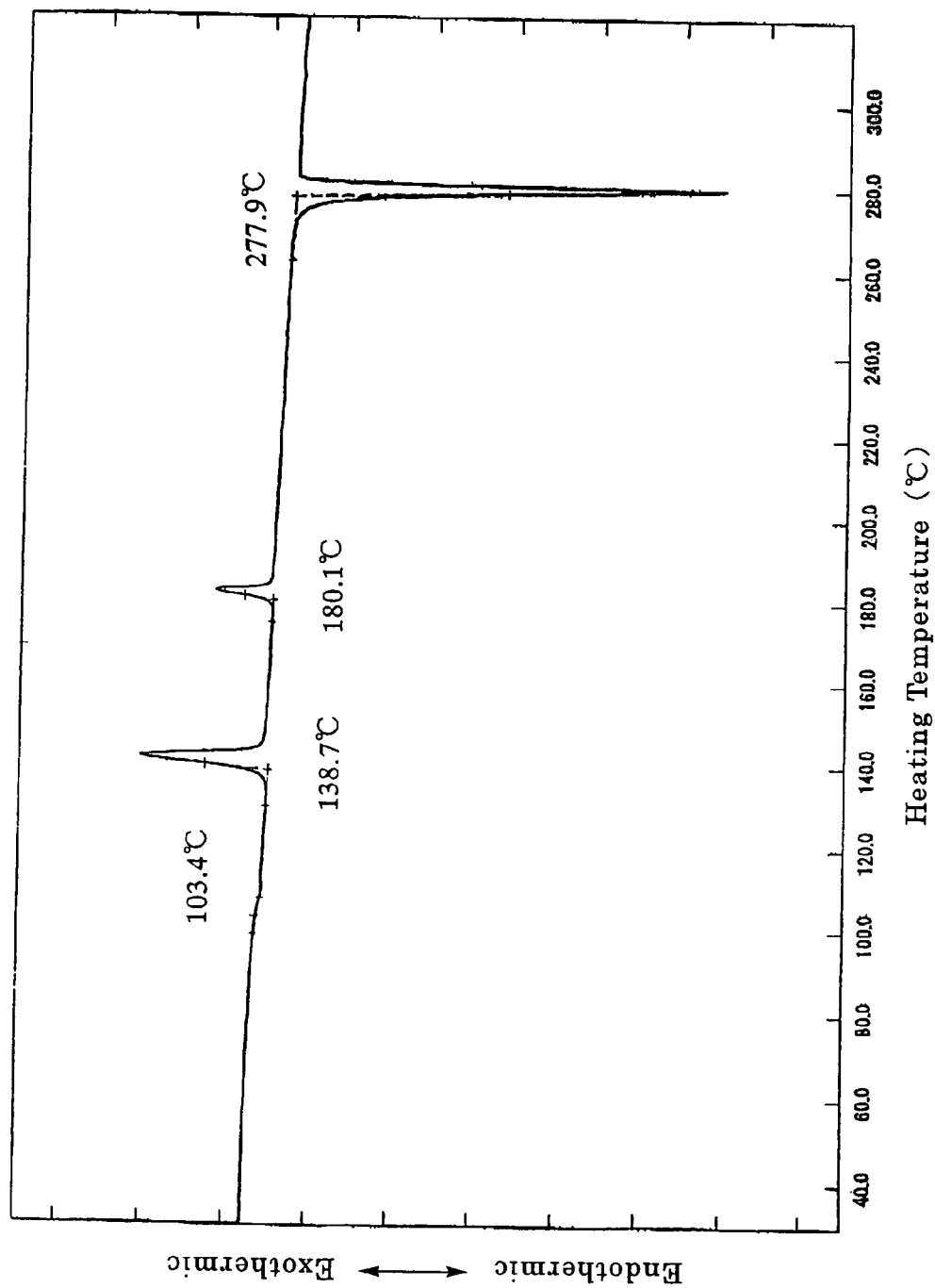
FIG. 2 is a differential scanning calorimetry (DSC) curve of 1,3,5-tris(N-(4'-methyl-4-biphenylyl)-N-(p-tolyl)amino)benzene (p-MBTAB), one of the organo-electronic functional material according to the invention.

Differential Scanning Calorimetry (DSC):

About 5 mg of p-MBTAB was weighed as a sample, and it was melted in a differential scanning calorimetric device and cooled to room temperature at a rate of 50° C. per minute. The sample did not crystallized, but it became amorphous glass. Subsequently, the thermal characteristics of the sample were measured by heating at a rate of 5° C. per minute by using an aluminum plate as a reference. As the DSC chart is shown in FIG. 2, the compound was found to have a glass transition temperature (Tg) of 103.4° C., a crystallization temperature (Tc) of 138.7° C. and 180.1° C., and a melting point of 277.9° C.

Figure 3:
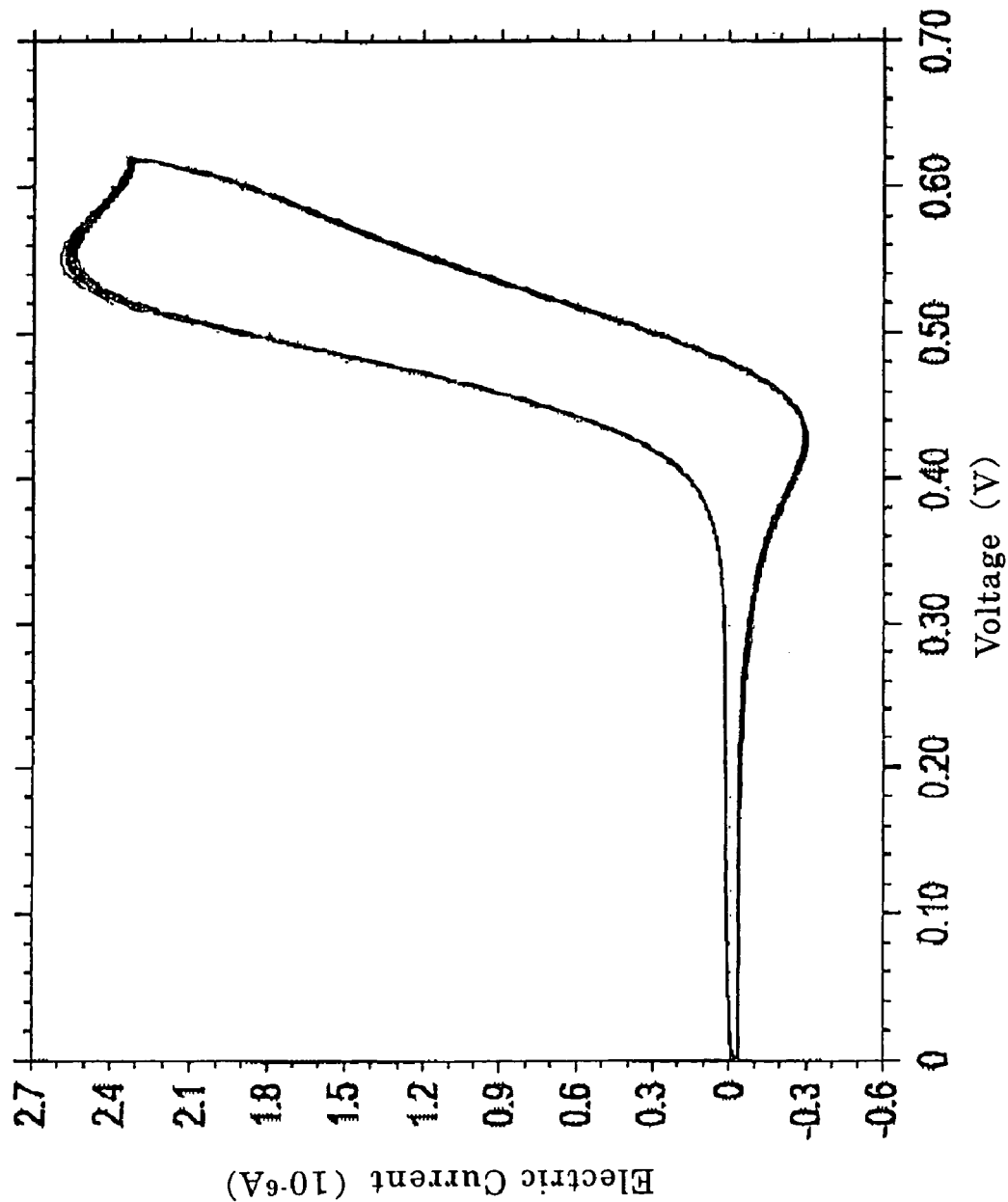
FIG. 3 is a cyclic voltamogram of 1,3,5-tris(N-(4'-methyl-4-biphenylyl)-N-(p-tolyl)amino)benzene (p-MBTAB), one of the organo-electronic functional material according to the invention.

Cyclic Voltammetry (CV):

p-MBTAB was dissolved in dichloromethane and the solution was arranged at a concentration of $10^{-3}$ M. The oxidation-reduction characteristics of the sample were measured using tetrabutylammonium perchlorate ((n-C$_4$H$_9$)$_4$NClO$_4$ (0.1M)) as a supporting electrolyte and Ag/Ag$^+$ as a reference electrode at a scan speed of 20 mV/s. As the CV chart is shown in FIG. 3, the oxidation potential defined as an average of peak potential of oxidation curve and peak potential of reduction curve is 0.49 V (vs. Ag/Ag$^+$), and the oxidation-reduction process was found to be reversible in 50 times measurement. In addition, the peak current of oxidation curve had an average of $2.565 \times 10^{-6}$ A, a maximum of $2.596 \times 10^{-6}$ A and a minimum of $2.533 \times 10^{-6}$ A, and hence the deviation was only within ±1.21%. Thus, p-MBTAB had stable oxidation-reduction characteristics and was almost free from deterioration in repeated oxidation-reduction process.

Comparative Example 1

Preparation of 1,3,5-tris(1-naphthylamino)benzene 4.4 g of phloroglucinol, 25 g of 1-naphthylamine and 0.5 g of iodine were placed in a 100 mL capacity three necked flask and the reaction was carried out at a temperature of 140° C. for 4 hours with stirring under a nitrogen atmosphere. After the reaction, the resultant reaction mixture was washed with methanol, hexane and methanol in this order, followed by drying to provide 4.4 g of the desired 1,3,5-tris(1-naphthylamino)benzene as slightly reddish solid. The yield was 25%.

Preparation of 1,3,5-tris(N-(4-biphenylyl)-N-(1-naphthyl)amino)-benzene (TBNAB)

2.0 g of 1,3,5-tris(1-naphthylamino)benzene, 5.0 g of 4-iodobiphenyl, 3.7 g of potassium carbonate, 2 g of copper powder, 0.3 g of 18-crown-6 (or 1,4,7,10,13,16-hexaoxacyclooctadecane) and 10 mL of mesitylene (reaction solvent) were placed in a 100 mL capacity glass flask and the reaction was carried out at a temperature of 170° C. for 17 hours under a nitrogen atmosphere. After the reaction, the resultant reaction mixture was extracted with toluene and the toluene solution was subjected to silica gel chromatography to fractionate the reaction product. The reaction product was then purified by recrystallization from a mixed solvent of toluene/hexane and then by sublimation to provide 1.2 g of the desired 1,3,5-tris(N-(4-biphenylyl)-N-(1-naphthyl)amino)benzene (TBNAB). The yield was 32%.

Elemental Analysis (%):

|  | C | H | N |
|---|---|---|---|
| Calculated: | 90.25 | 5.36 | 4.39 |
| Measured: | 89.96 | 5.44 | 4.32 |

Mass Analysis: 957 (M$^+$)

Figure 4:
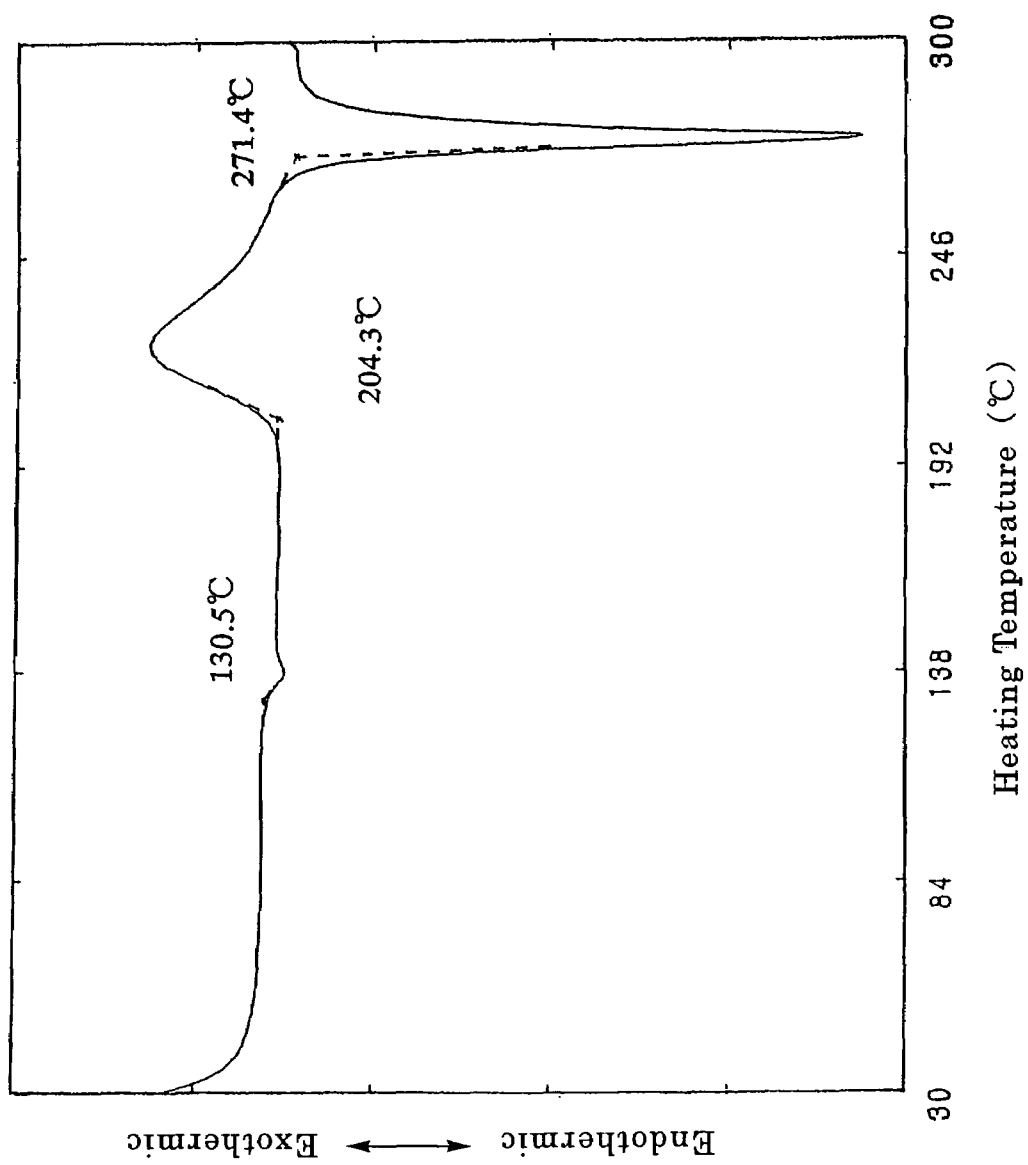
FIG. 4 is a differential scanning calorimetry (DSC) curve of 1,3,5-tris(N-(4-biphenylyl)-N-(1-naphthyl)amino)benzene (TBNAB), one of the organo-electronic functional materials of comparative example.

Differential Scanning Calorimetry (DSC):

About 5 mg of TBNAB was weighed as a sample, and it was melted in a differential scanning calorimetric device and cooled to room temperature at a rate of 50° C. per minute. The sample did not crystallized, but it became amorphous glass. Subsequently, the thermal characteristics of the sample were measured by heating at a rate of 5° C. per minute by using an aluminum plate as a reference. As the DSC chart is shown in FIG. 4, the compound was found to have a glass transition temperature (Tg) of 130° C., a crystallization temperature (Tc) of 204° C. and a melting point (Tm) of 271° C.

Figure 5:
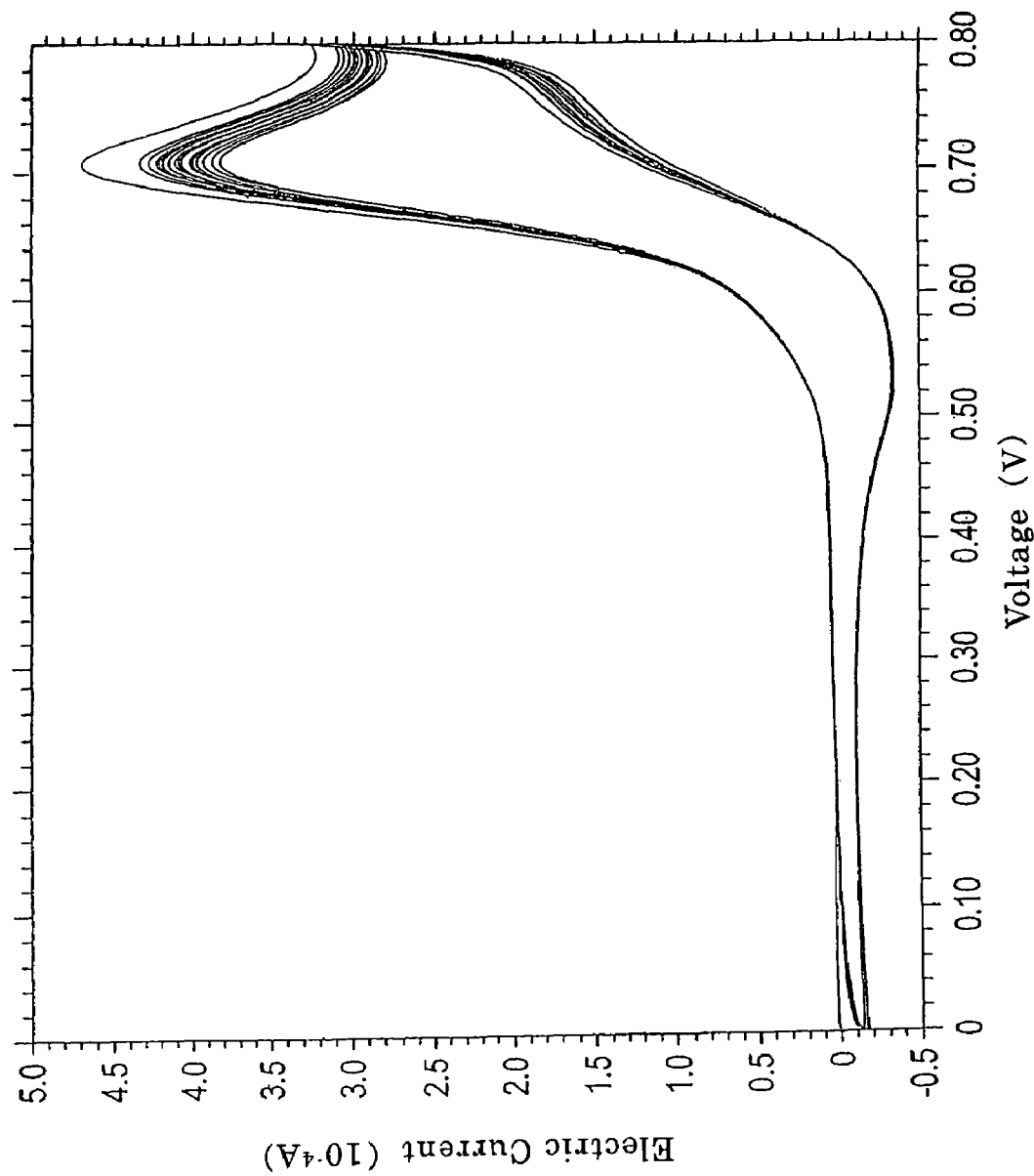
FIG. 5 is a cyclic voltamogram of 1,3,5-tris(N-(4-biphenylyl)-N-(1-naphthyl)amino)benzene (TBNAB), one of the organo-electronic functional materials of comparative examples.

Cyclic Voltammetry (CV):

TBNAB was dissolved in dichloromethane and the solution was subjected to measurement of oxidation-reduction characteristics in the same manner as Example 1. As the CV chart is shown in FIG. 5, the compound had an oxidation potential of 0.6 V (vs. Ag/Ag$^+$). It was found that the compound had reversibility in oxidation-reduction process after 50 times measurements. However, it was found that the peak current of oxidation curve had an average of $4.257 \times 10^{-4}$ A, a maximum of $4.687 \times 10^{-4}$ A and a minimum of $3.816 \times 10^{-6}$ A, and the deviation was as large as ±10.1%.

Example 2

A sheet of plate glass having an ITO coating on one face (available from Sanyo Vacuum K.K.) was subjected to ultrasonic cleaning using acetone and then steam cleaning using methanol, followed by irradiation with ultraviolet rays by using a low-pressure mercury lamp for 10 minutes. Immediately after the irradiation, copper phthalocyanine (CuPC) was vapor deposited to form a hole injecting layer 20 nm thick and then p-MBTAB was vapor deposited to form a hole transporting layer 40 nm thick in this order on the ITO coating by using a vacuum deposition apparatus. Subsequently, an emission layer 75 nm thick was formed of tris(8-quinolinol)aluminum (Alq$_3$) on the hole transporting layer, and then a lithium fluoride layer 0.5 nm thick and an aluminum layer 100 nm thick were layered in this order on the emission layer to form a cathode, thereby providing an organic electroluminescence element.

Figure 6:
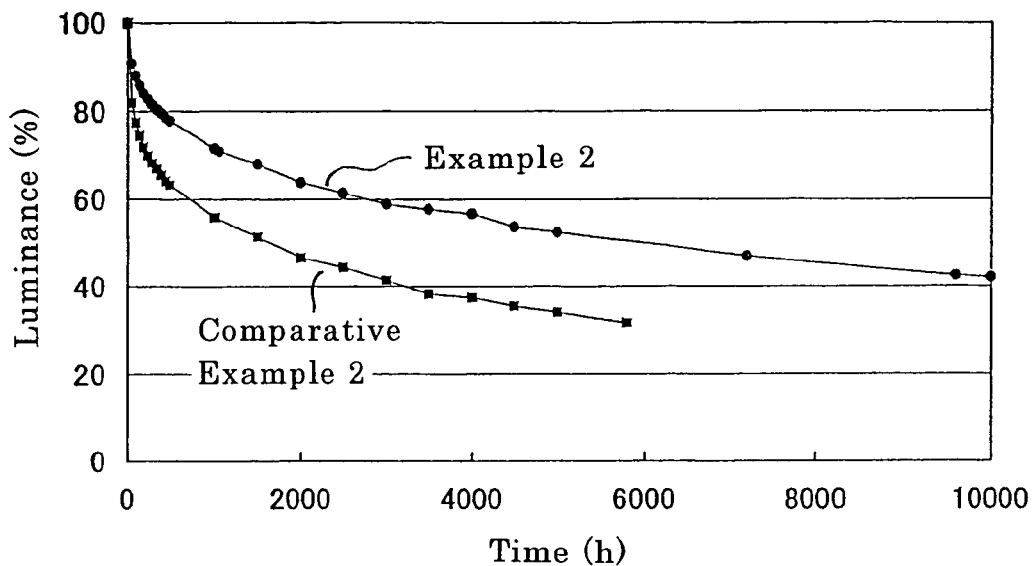
FIG. 6 is a graph showing time-luminance characteristic of an organic electroluminescence element having a hole transporting layer formed of a hole transporting agent, 1,3,5-tris(N-(4'-methyl-4-biphenylyl)-N-(p-tolyl)amino)benzene (p-MBTAB), one of the organo-electronic functional material of the invention (Example 2) and time-luminance characteristic of an organic electroluminescence element having a hole transporting layer formed of 1,3,5-tris(p-N-phenyl-N-m-tolyl)phenyl)benzene (m-MTDAPB), one of hole transporting agents of comparative examples (Comparative Example 2)
Figure 7:
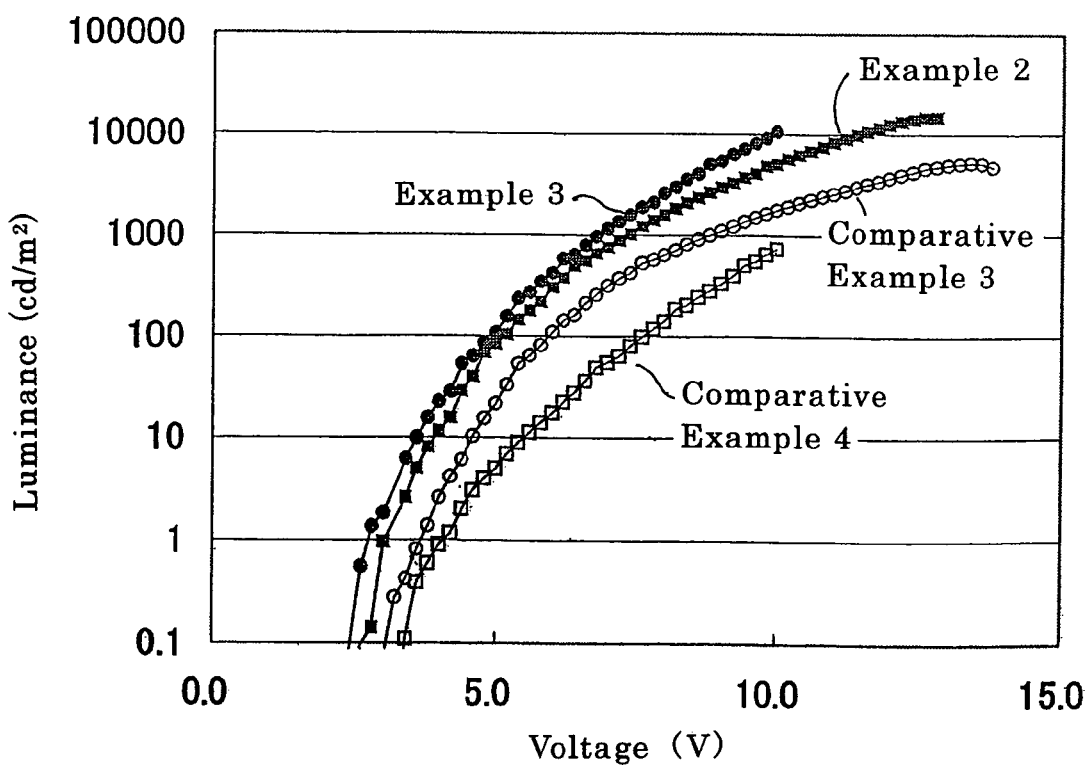
FIG. 7 is a graph showing a voltage-luminance characteristics of each of an organic electroluminescence element having a hole injecting layer formed of copper phthalocyanine and a hole transporting layer formed of an organo-electronic functional material according to the invention (Example 2), an organic electroluminescence element having a hole injecting layer formed of 2-TNATA and a hole transporting layer formed of p-MBTAB, one of the organo-electronic functional material according to the invention (Example 3), an organic electroluminescence element having a hole injecting layer formed of 2-TNATA and a hole transporting layer formed of 4,4'-bis[N-(1-naphthyl)-N-phenylamino]-biphenyl (α-NPD) (Comparative Example 3), and an organic electroluminescence element having a hole injecting layer formed of copper phthalocyanine and a hole transporting layer formed of α-NPD) (Comparative Example 4).

The change of luminance with time was examined by applying voltage across the electrodes of the organic electroluminescence element, letting the initial luminance (1000 cd/m$^2$) be 100%. The results are shown in FIG. 6. The voltage-luminance characteristics of the organic electroluminescence element were also examined by applying voltage across the electrodes. The results are shown in FIG. 7.

Comparative Example 2

1,3,5-Tris(p-N-phenyl-N-m-tolyl)aminophenyl)benzene (m-MTDAPB) was used in place of p-MBTAB, and otherwise in the same manner as Example 1, an organic electroluminescence element was obtained. The change of luminance with time was examined by applying voltage across the electrodes of the organic electroluminescence element, letting the initial luminance (1000 cd/m$^2$) be 100%.

As the results are shown in FIG. 6, the organic electroluminescence element having a hole transporting layer formed of p-MBTAB, a hole transporting agent of the invention, is superior in life to the organic electroluminescence element having a hole transporting layer formed of m-MTDAPB, a hole transporting agent of Comparative Example.

Example 3

A sheet of plate glass having an ITO coating on one face (available from Sanyo Vacuum K.K.) was subjected to ultrasonic cleaning using acetone and then steam cleaning using methanol, followed by irradiation with ultraviolet rays by using a low-pressure mercury lamp for 10 minutes. Immediately after the irradiation, 4,4',4''-tris(N-(2-naphthyl)-N-phenylamino)triphenylamine (2-TNATA) was vapor deposited to form a hole injecting layer 50 nm thick and then p-MBTAB was vapor deposited to form a hole transporting layer 10 nm thick in this order on the ITO coating by using a vacuum deposition apparatus. Subsequently, an emission layer 75 nm thick was formed of tris(8-quinolinol)aluminum (Alq$_3$) on the hole transporting layer, and then a lithium fluoride layer 0.5 nm thick and an aluminum layer 100 nm thick were layered in this order on the emission layer to form a cathode, thereby providing an organic electroluminescence element.

The voltage-luminance characteristics of the organic electro-luminescence element were examined by applying voltage across the electrodes. The results are shown in FIG. 7.

Comparative Example 3

4,4'-bis[N-(1-naphthyl)-N-phenylamino]biphenyl (α-NPD) was used in place of p-MBTAB, and otherwise in the same manner as Example 1, an organic electroluminescence element was obtained. The voltage-luminance characteristics of the organic electroluminescence element were examined by applying voltage across the electrodes. The results are shown in FIG. 7.

Comparative Example 4

Copper phthalocyanine (CuPC) was used in place of 2-TNATA to form a hole injecting layer 20 nm thick and then α-NPD was used in place of p-MBTAB to form a hole transporting layer 40 nm thick on the hole injecting layer, and otherwise in the same manner as Example 3, an organic electroluminescence element was obtained. The voltage-luminance characteristics of the organic electroluminescence element was examined by applying voltage across the electrodes.

As the results are shown in FIG. 7, the organic electroluminescence elements each having the hole transporting layer formed of p-MBTAB, a hole transporting agent of the invention, and a hole injecting layer formed of the known hole injecting agent (Examples 2 and 3) had a higher luminance than the organic electroluminescence elements each having a hole transporting layer formed of the known hole transporting agent and a hole injecting layer formed of the known hole injecting agent (Comparative Examples 3 and 4) when the same voltage was applied.

The invention claimed is:

1. An organo-electronic functional material comprising a tris(arylamino)benzene represented by the general formula (I)

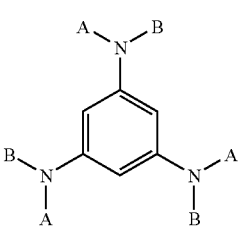

wherein A and B are each a group represented by the general formula (II)

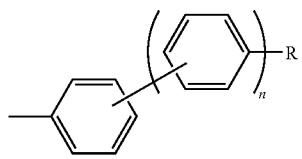

in which R is an alkyl group of 1-6 carbons or a cycloalkyl group of 5 or 6 carbon atoms and n is 0, 1, 2 or 3, provided that n is 1, 2, or 3 in at least one of A and B, and exhibiting a cyclic voltamogram in which a deviation of peak current of cyclic curves as measured 50 times at a sweep rate of 20 mV/s falls within ±10% of the average of peak current.

2. The organo-electronic functional material as claimed in claim 1, wherein the tris(arylamino)benzene comprises the group A, which is a biphenylyl or a terphenyl group that is substituted with an alkyl group of 1-6 carbons or a cycloalkyl group of 5 or 6 carbon atoms at the terminal phenyl group thereof and the group B, which is a phenyl group that is substituted with an alkyl group of 1-6 carbons or a cycloalkyl group having 5 or 6 carbons.

3. The organo-electronic functional material as claimed in claim 1, in which the tris(arylamino)benzene is 1, 3, 5-tris(N-(4'-methyl-4-biphenylyl)-N-(p-tolyl)armino)benzene.

4. A hole transporting agent, the agent comprising the organo-electronic functional material as claimed in claim 1.

5. An organic electroluminescence element, the element having a hole transporting layer containing the bole transporting agent as claimed in claim 4.

6. An organic electroluminescence element, the element having a hole transporting layer containing the hole transporting agent as claimed in claim 4 and a hole injecting layer containing a hole injecting agent comprising a tris (4-(N,N-diarylamino)phenyl)amnine represented by the general formula (III)

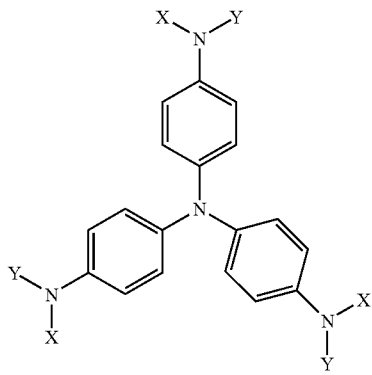

wherein X and Y are each an aryl group and may be the same or different from each other.

* * * * *